United States Patent [19]

Yanagisawa et al.

[11] Patent Number: 4,716,382

[45] Date of Patent: Dec. 29, 1987

[54] MICROWAVE AMPLIFYING APPARATUS

[75] Inventors: Wasuke Yanagisawa; Kenichi Muramatsu, both of Tokyo, Japan

[73] Assignee: Yokowo Mfg. Co., Ltd., Tokyo, Japan

[21] Appl. No.: 922,602

[22] Filed: Oct. 24, 1986

[30] Foreign Application Priority Data

Nov. 25, 1985 [JP] Japan ................................ 60-264590

[51] Int. Cl.[4] ................................................ H03F 3/60

[52] U.S. Cl. ........................................ 330/286; 330/56

[58] Field of Search ........................ 330/56, 57, 286, 53

[56] References Cited

U.S. PATENT DOCUMENTS 4,303,892 12/1981 Weller et al. ........................ 330/286

*Primary Examiner*—Gene Wan

*Attorney, Agent, or Firm*—Jordan and Hamburg

[57] ABSTRACT

A microwave amplifying apparatus includes a waveguide which is shorted at one end and supplied with a TM mode or a TE mode signal, a pickup probe mounted on the waveguide for converting the signal into a TEM mode signal, and microstrip lines and field effect transistors, or amplifier elements, for amplifying the TEM mode signal. A matching device is arranged on the shorted waveguide adjacent to an incidence side with respect to the pickup probe while an input terminal of the first-stage amplifier element is directly interconnected to an output terminal of the pickup probe. The device is, therefore, free from a signal loss otherwise developed between the pickup probe and the initial-stage amplifier element. The matching device consists of three conductive rods which are spaced a quarter-wavelength distance from each other, and three lock nuts for fixing the conductive rods.

6 Claims, 2 Drawing Figures

MICROWAVE AMPLIFYING APPARATUS

BACKGROUND OF THE INVENTION

The present invention relates to an apparatus for converting the transmission mode of a microwave signal which is applied to a waveguide, amplifying the signal in the converted mode, and delivering the amplified signal to a subsequent circuit element via a microstrip line.

While the transmission mode of a microwave signal which is transmitted by a waveguide is generally a TE mode or a TM mode, that of a signal which is transmitted by a microstrip line is a TEM mode. To transmit a microwave signal from a waveguide to a microstrip line, therefore, the transmission mode of the signal is converted from the TE mode or the TM mode to the TEM mode while, at the same time, the signal is amplified to a suitable degree.

A prior art microwave amplifying apparatus constructed to output an amplified microwave signal from a waveguide via a microstrip line includes a waveguide having a pickup probe and shorted at one end thereof, and a mount joined with the waveguide and provided with an MIC base thereon. The waveguide is hollow and rectangular in cross-section. The MIC base is loaded with, for example, a first to a third microstrip lines, a first field effect tranistor (FET) adapted for amplification which is interconnected between the first and second microstrip lines, and a second FET for amplification interconnected between the second and third microstrip lines. Each of the microstrip lines is provided with a plurality of stubs for matching the impedance of the microstrip line to that of the FET.

The first microstrip line is built in to optimize the noise factor of the first FET which serves as a first-stage amplifier element of the amplifying apparatus. A problem brought about in this construction is that a dielectric loss is produced in the first microstrip line. As for a microwave signal lying in a 10 gigahertz frequency band, for example, a dielectric loss of approximately 0.2 decibel is observed for a length of 1 centimeter of the microstrip line. In this condition, the signal level applied to an input portion of the first-stage FET is lower than that which appears at an output terminal of the pickup probe, making the noise factor poorer correspondingly. Hence, the noise factor attainable with the prior art amplifying apparatus is not fully acceptable.

SUMMARY OF THE INVENTION

It is an object of the present invention to provide a microwave amplifying apparatus which achieves a desirable noise factor with a minimum of signal level loss allowed to occur.

It is another object of the present invention to provide a generally improved microwave amplifying apparatus.

A device for converting a transmission mode of a microwave signal applied to the device and amplifying the signal so as to output the amplified signal of the present invention comprises a hollow conductive waveguide having a predetermined cross-section and shorted at one end of the waveguide, a pickup probe mounted on the waveguide adjacent to the one end for converting the transmission mode of the microwave signal which is applied to the waveguide, a matching device disposed between the one end and the other end of the waveguide for adjusting an impedance of the waveguide, an amplifier element having an input terminal which is directly interconnected to an output terminal of the pickup probe, and a microstrip line having an input terminal interconnected to an output terminal of the amplifier element and an output terminal interconnected to a subsequent circuit element which is located outside the device.

In accordance with the present invention, a microwave amplifying apparatus includes a waveguide which is shorted at one end and supplied with a TM mode or a TE mode signal, a pickup probe mounted on the waveguide for converting the signal into a TEM mode signal, and microstrip lines and field effect transistors, or amplifier elements, for amplifying the TEM mode signal. A matching device is arranged on the shorted waveguide adjacent to an incidence side with respect to the pickup probe while an input terminal of the first-stage amplifier element is directly interconnected to an output terminal of the pickup probe. The device is, therefore, free from a signal loss otherwise developed between the pickup probe and the initial-stage amplifier element. The matching device consists of three conductive rods which are spaced a quarter-wavelength distance from each other, and three lock nuts for fixing the conductive rods.

The above and other objects, features and advantages of the present invention will become more apparent from the following detailed description taken with the accompanying drawings.

DESCRIPTION OF THE PREFERRED EMBODIMENT

Figure 1:
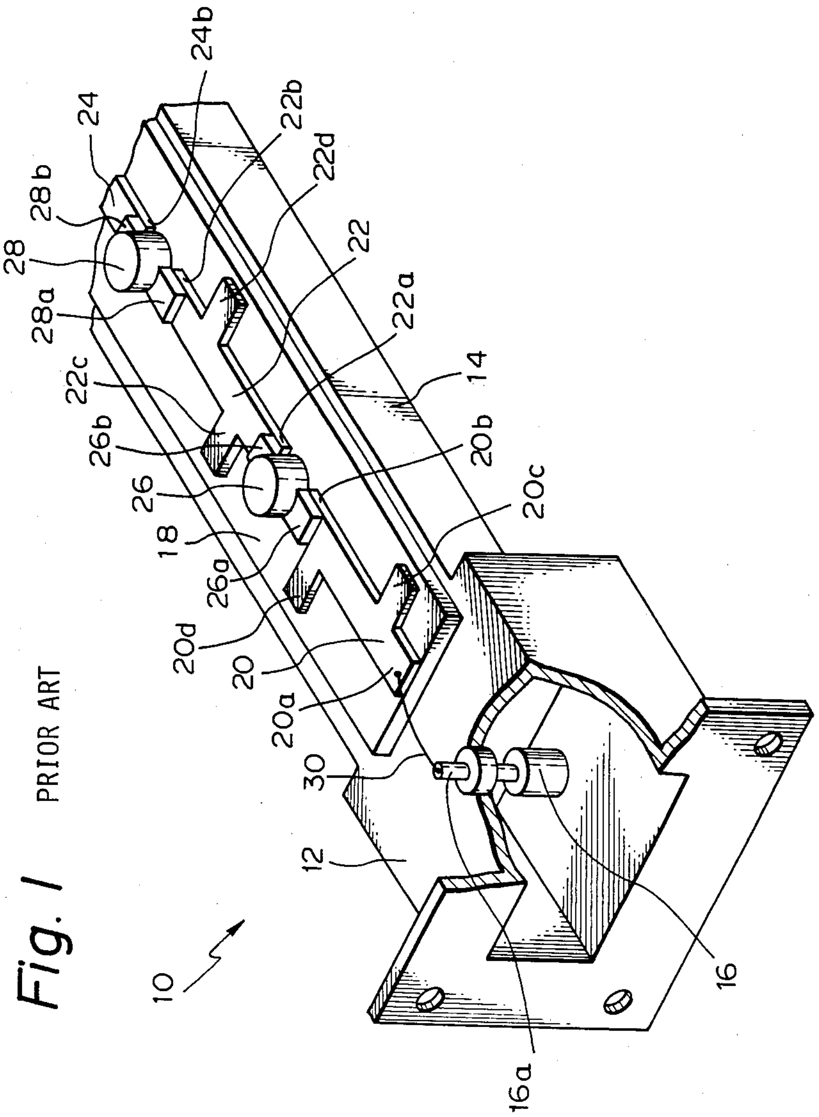
Fig. 1 PRIOR ART
FIG. 1 is a partly taken away perspective view of a prior art microwave amplifying apparatus.

To better understand the present invention, a brief reference will be made to a prior art microwave amplifying apparatus, shown in FIG. 1. The prior art apparatus, generally 10, includes a hollow metalllic waveguide 12 which is provided with a rectangular cross-section and shorted at one end thereof. A mount 14 is joined integrally with the waveguide 12. A pickup probe 16 is mounted on the waveguide 12, and an MIC base 18 on the top of the mount 14. A first to a third microstrip lines 20, 22 and 24 and a first and a second FETs 26 and 28 adapted for amplification are arranged on the MIC base 18. The pickup probe 16 has an output terminal 16*a* which is interconnected to one end 20*a* of the first microstrip line 20 by a connecting member 30. The other end 20*b* of the microstrip line 20 is interconnected to an input terminal 26*a* of the first FET 26, which serves as a first-stage amplifier element. An output terminal 26*b* of the FET 26 is interconnected to one end 22*a* of the second microstrip line 22. The other end 22*b* of the microstrip line 22 is interconnected to an input terminal 28*a* of the second FET 28. An output terminal 28*b* of the FET 28 is interconnected to one end 24*a* of the third microstrip line 24, the other end of the microstrip line 24 being interconnected to a desired circuit element, not shown. The first microstrip line 20 is provided with stubs 20*c* and 20*d* and the second microstrip line 22 with stubs 22*c* and 22*d*. The stubs 20*c*, 20*d*, 22*c* and 22*d* constitute an impedance adjusting circuit, and their positions, lengths and others are adjustable to match the impedances of the microstrip lines to those of the FETs 26 and 28.

In operation, a TE mode or a TM mode microwave signal which is incident to the shorted waveguide 12 is converted to a TEM mode signal by the pickup probe 16. In response to the output of the pickup probe 16, the stubs 20*c* and 20*d* of the first microstrip line 20 are adjusted to match the impedance of the strip line 20 to that of the first FET 26, whereby an optimum noise factor is set up in the FET 26. Further, the signal amplified by the FET 26 is applied to the second FET 28 with the stubs 22*c* and 22*d* of the second microstrip line 22 adjusted for impedance matching, the signal being suitably amplified by the FET 28.

In the prior art microwave amplifying apparatus 10, a dielectric loss is produced in the first microstrip line 20 which is adapted to optimize the noise factor of the first FET 26, as previously described. As a result, the signal power applied to the input terminal 26*a* of the first FET 26 is lowered beyond the signal power which appears at the output end 16*a* of the pickup probe 16, deteriorating the noise factor correspondingly. For this reason, the prior art apparatus 10 is incapable of attaining a satisfactory noise factor.

Figure 2:
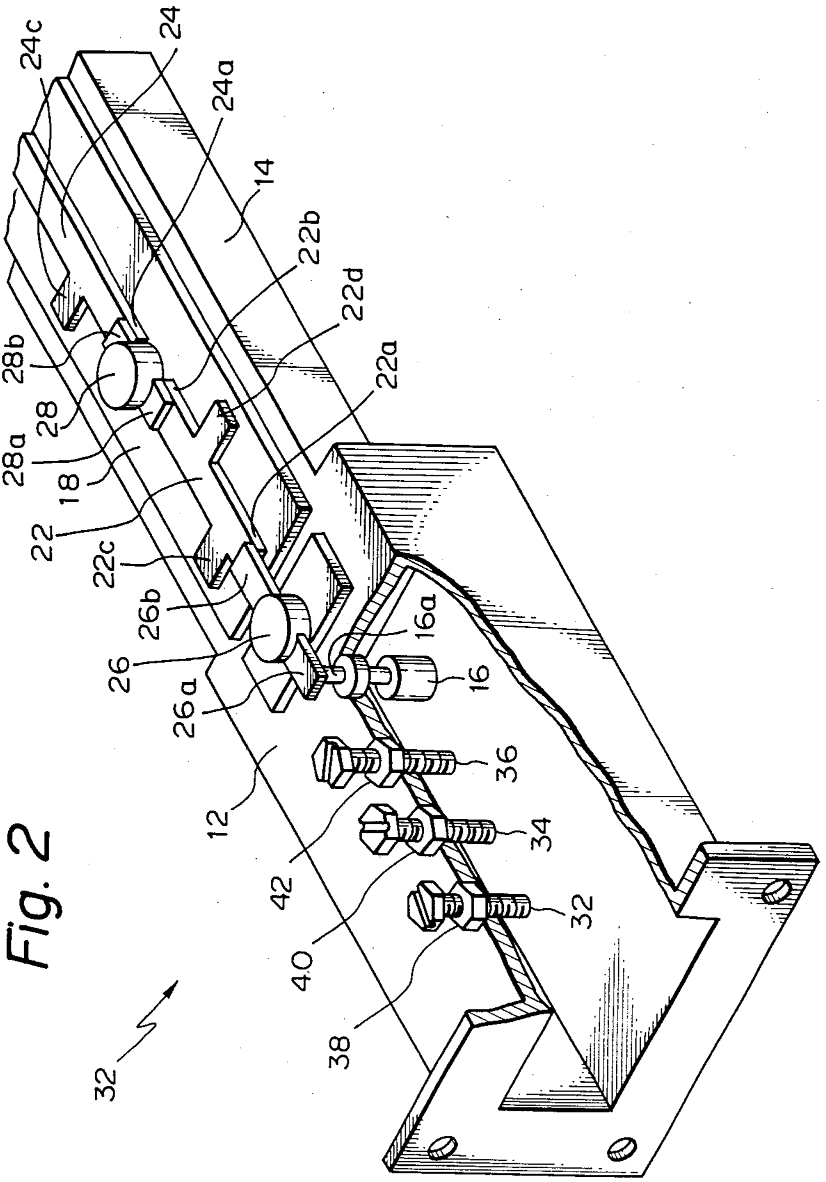
FIG. 2 is a partly taken away perspective view of a microwave amplifying apparatus in accordance with the present invention.

Referring to FIG. 2, a microwave amplifying apparatus embodying the present invention is shown and generally designated by the reference numeral 32. In FIG. 2, the same or similar structural elements as those shown in FIG. 1 are designated by like reference numerals and will not be described in detail to avoid redundancy.

In FIG. 2, the apparatus 32 includes a waveguide 12 which is provided with a pickup probe 16. Three screws 32, 34 and 36 which serve as conductive rods are threaded into the waveguide 12 in parallel to a field direction and on an incidence side of the waveguide 12 with respect to the pickup probe 16. The screws 32, 34 and 36 are arranged one after another on the centerline of and in the axial direction of the waveguide 12 at a quarter-wavelength distance from each other. Lock nuts 38, 40 and 42 are respectively threaded over the screws 32, 34 and 36 to fix them to the waveguide 12. The screws 32, 34 and 36 are each adjustable in the length of projection into the shorted waveguide 12, constituting a matching device which is generally referred to as three stubs. Further, a input terminal 26*a* of a first FET 26 is disposed on the upper surface of the waveguide 12 adjacent to an output end 16*a* of the pickup probe 16. That, is the output end 16*a* of the pickup probe 16 is directly interconnected to the input terminal 26*a* of the first FET 26, which serves as a first-stage amplifier element. An output terminal 26*b* of the FET 26 is interconnected to one end 22*a* of a microstrip line 22 which is provided on the upper surface of an MIC base 18.

In the construction described above, a TE mode or a TM mode microwave signal incident to the waveguide 12 is converted by the pickup probe 16 into a TEM mode signal and, then, applied from the output terminal 16*a* to the input terminal 26*a* of the FET 26 immediately. This eliminates a signal loss during the propagation of the signal from the pickup probe 16 to the FET 26 so that the signal level applied to the FET 26 can be increased, compared to the prior art device 10. In addition, the three screws 32, 34 and 36 are adjustable to match the impedance of the waveguide 12 to that of the first FET 26 and, hence, a signal which is lower in loss level than at the output end 16*a* of the pickup probe 16 can be fed to the FET 26. Such enhances the noise factor of the FET 26 and, therefore, that of the device 32 as a whole.

It is to be noted that while the illustrative embodiment uses a three-stub type matching device, any other suitable impedance matching implementation may be used such as a tuning window.

In summary, it will be seen that the present invention provides a microwave amplifying apparatus which eliminates a signal loss between a pickup robe and a first-stage amplifier element and, in addition, achieves impedance matching by means of a matching device. This allows a high-level signal to be applied to an input terminal of the first-stage amplifier element and, thereby, enhances a noise factor. Such an advantage is derived from a unique construction in which a matching device is located adjacent to an incidence side of a waveguide with respect to a pickup probe while the input terminal of the amplifier element is directly interconnected to an output terminal of the pickup probe.

Various modifications will become possible for those skilled in the art after receiving the teachings of the present disclosure without departing from the scope thereof.

What is claimed is:

1. A device for converting a transmission mode of a microwave signal applied to said device and amplifying said signal so as to output said amplified signal, comprising:

a hollow conductive waveguide having a predetermined cross-section and shorted at one end of said waveguide;

a pickup probe mounted on said waveguide adjacent to said one end for converting the transmission mode of said microwave signal which is applied to said waveguide;

matching means disposed between said one end and the other end of said waveguide for adjusting an impedance of said waveguide;

an amplifier element having an input terminal which is directy interconnected to an output terminal of said pickup probe; and a microstrip line having an input terminal interconnected to an output terminal of said amplifier element and an output terminal interconnected to a subsequent circuit element which is located outside said device.

2. An device as claimed in claim 1, wherein said matching means comprises a plurality of conductive rods which are arranged one after another at predetermined equal distances on a centerline of said waveguide and in an axial direction of said waveguide.

3. An device as claimed in claim 2, wherein said plurality of conductive rods comprise three screws which are threaded into said waveguide while being spaced a quarter-wavelength distance from each other, said screws being individually adjustable in a length of projection into said waveguide.

4. An device as claimed in claim 3, wherein said matching means further comprises three lock nuts for fastening said screws to said waveguide.

5. An device as claimed in claim 1, wherein said microstrip line comprises stubs for matching an impedance of said microstrip line to that of said amplifier element.

6. An device as claimed in claim 1, further comprising a mount joined with said waveguide for supporting an MIC base which is loaded with said amplifier element and microstrip line.

* * * * *